(12) United States Patent
Sridhara

(10) Patent No.: US 9,001,568 B2
(45) Date of Patent: Apr. 7, 2015

(54) TESTING SIGNAL DEVELOPMENT ON A BIT LINE IN AN SRAM

(75) Inventor: Srinivasa Raghavan Sridhara, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 277 days.

(21) Appl. No.: 13/611,863

(22) Filed: Sep. 12, 2012

(65) Prior Publication Data

US 2014/0071736 A1    Mar. 13, 2014

(51) Int. Cl.
*G11C 11/00*    (2006.01)
*G11C 29/50*    (2006.01)
*G11C 11/41*    (2006.01)

(52) U.S. Cl.
CPC .......... *G11C 29/50012* (2013.01); *G11C 11/41* (2013.01)

(58) Field of Classification Search
USPC .............. 365/49.1, 49.11, 154, 156, 201, 200
See application file for complete search history.

(56) References Cited

U.S. PATENT DOCUMENTS

| | | | |
|---|---|---|---|
| 7,952,955 B2 * | 5/2011 | Kodama | 365/230.06 |
| 8,125,845 B2 * | 2/2012 | Komatsu et al. | 365/203 |
| 2012/0230126 A1 * | 9/2012 | Ramaraju et al. | 365/189.06 |

* cited by examiner

*Primary Examiner* — Thao H Bui
(74) *Attorney, Agent, or Firm* — John R. Pessetto; Frank D. Cimino

(57) ABSTRACT

An embodiment of the invention discloses a method for testing a memory cell in an SRAM. The number of dummy memory cells on a single dummy word line used to drive the dummy bit lines is selected. A binary logical value is written to a memory cell in the SRAM. The single dummy word line and a word line containing the memory cell in the SRAM are driven to logical high values concurrently. A dummy bit line, driven by the dummy memory cells, drives an input of a buffer to a binary logical value stored in the dummy memory cells. An output of the buffer enables a sense amp to amplify a voltage developed across the bit lines electrically connected to the memory cell.

12 Claims, 5 Drawing Sheets

US 9,001,568 B2

TESTING SIGNAL DEVELOPMENT ON A BIT LINE IN AN SRAM

BACKGROUND

This invention relates to integrated circuits, particularly to static random access memory (SRAM) devices, in either embedded form or stand alone (i.e. discrete) form.

Memory cells in SRAM devices store logical binary values (i.e. either a logical one or a logical zero). When a memory cell is selected by a word line during a read, the voltage on a latch in the memory cell begins to change the voltages on the bit lines attached to the memory cell (i.e. signal is developing on the bit lines). Because the signal on the bit lines is initially small, a certain amount of time must pass to allow the signal on the bit lines to grow larger. When the signal on the bit lines reaches a certain value, this value may be sensed by a sense amp. The sense amp increases the voltage found on the bit lines so that the signal may be transferred to another part of the SRAM.

When data is read from an SRAM memory cell and the time allowed for the signal on the bit lines to increase is too short, the sense amp may fail to amplify the correct logical value and an error occurs in the SRAM. When data is read from an SRAM memory cell and the time allowed for the signal on the bit lines to increase is too long, the sense amp properly amplifies the correct logical value. However, because the time allowed was long, the read access time of the SRAM increases. In order to keep the read access time as short as possible and read correct data, it is important to be able to vary the amount of time allowed for the signal on the bit lines to develop. Further, it is important to test SRAMs to ensure the availability of sufficient read margin by varying the amount of time allowed for a signal to develop on the bit lines during a read of an SRAM memory cell.

DETAILED DESCRIPTION

The drawings and description, in general, disclose a method and an electrical device for determining the signal development time of a memory cell in an SRAM. In an embodiment of the invention, a fixed number of dummy memory cells on a dummy word line are selected to drive a pair of dummy bit lines when the dummy word line is selected. The fixed number of dummy memory cells each contains the same binary logical value (e.g. a logical one). After the number of fixed number of dummy memory cells have been selected, a binary logical value is written to a memory cell in the SRAM.

Next the dummy word line that is electrically connected to the selected dummy memory cell and the word line that is electrically connected to the memory cell that was written to with binary logical value, are driven to logical high values. When the dummy word line is driven to a logical high value, the selected dummy memory cells drive the dummy bit lines. When the word line is driven to a logical high value, the selected memory cell in the SRAM drives the bit lines. One of the dummy bit lines drives a buffer that in turn enables the sense amp electrically connected to the bit lines to amplify the voltage differential on the bit lines.

The signal on the bit lines is allowed to increase until the sense amp is enabled. The time allowed for the signal on the bit lines to be developed is determined by the delay from the dummy word line going to a logical high value to the time the sense amp is enabled. When the delay is too short, the sense amp will be enabled too early and the correct digital logical value may not be amplified. When the delay is too long, the sense amp will be enabled later than is necessary and the read time of the memory cell will increase.

The time allowed for the signal on the bit lines to be developed may be increased or decreased by changing the number of dummy memory cells that drives the dummy bit lines. For example, the time allowed for the signal on the bit lines to be developed may be decreased by increasing the number of dummy memory cells that drive the dummy bit lines. In another example, the time allowed for the signal on the bit lines to be developed may be increased by decreasing the number of dummy memory cells that drive the dummy bit lines. By varying the time allowed for signal to develop on the bit lines, a trade-off between access time and read margin is achieved.

Figure 1:
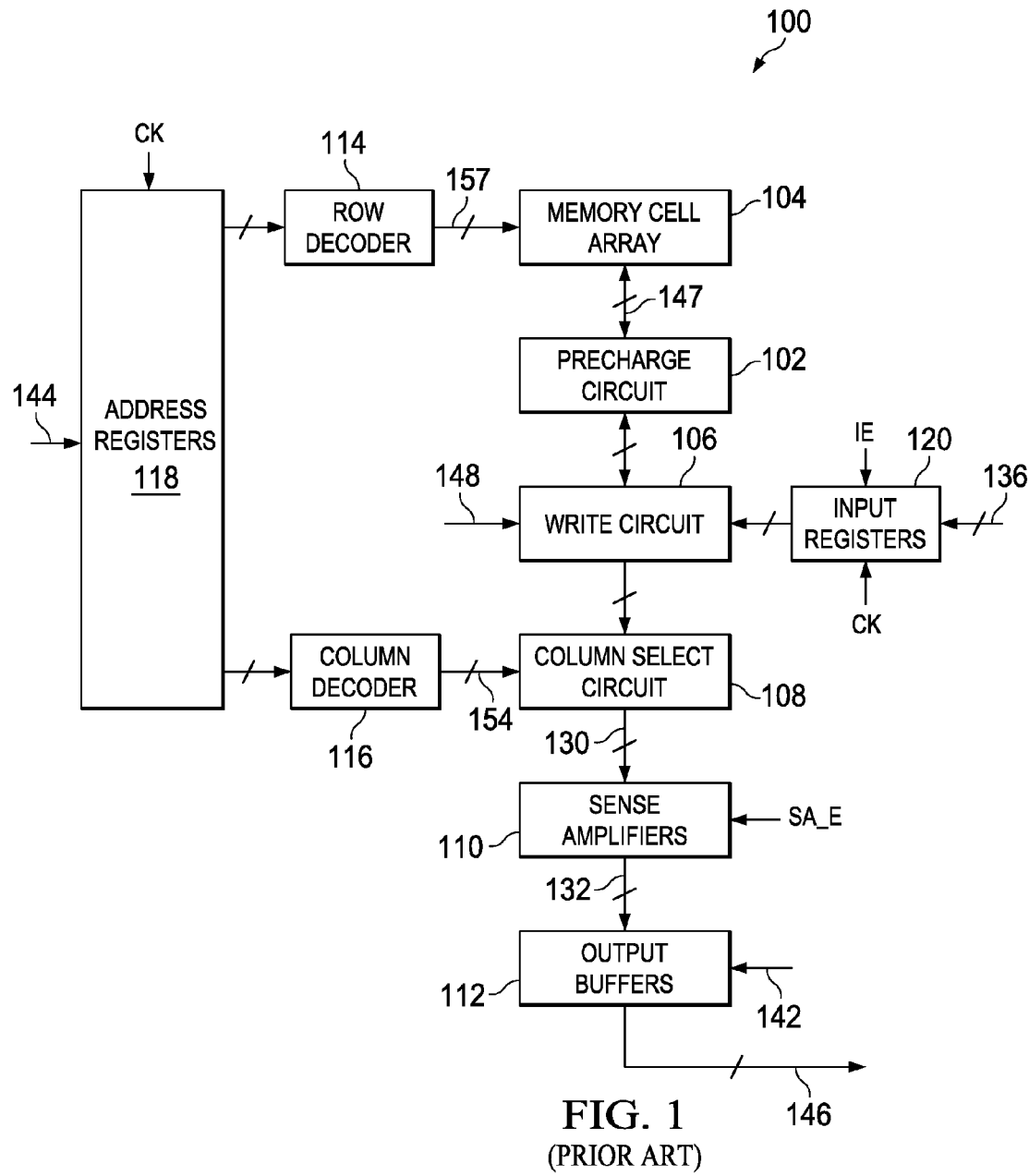
FIG. 1 is a block diagram of an SRAM (Static Random Access Memory). (Prior Art)

FIG. 1 is a block diagram of an SRAM (Static Random Access Memory) 100 (Prior Art). In this embodiment only a single array of SRAM cells 104 is shown for illustrative purposes. Typically, an SRAM has more than one array of SRAM cells. In this example, a pre-charge circuit 102 pre-charges the bit lines 147 in the memory cell array 104 to a predetermined voltage before the memory cell array 104 is either read from or written to.

When the memory cell array 104 is read from, an address 144 is input to the address registers 118. The address 144 stored in the address registers 118 is then clocked by a clock signal CK from the address registers to a row decoder 114 and a column decoder 116. In this example, the row decoder 114 drives a word line 157 in the memory cell array 104 to a logical high value. Memory cells attached to the selected word line provide data that is passed through the pre-charge circuit 102 and the write circuit 106 to the column select circuit 108. The column select circuit 108 selects what data 130 is provided to the sense amplifiers 110 based on the output 154 of the column decoder 116. The sense amplifiers 110 increase the voltage of the selected data 130 when the sense amplifiers are enabled by signal SA_E. The amplified signals 132 are sent to the output buffers 112. The output buffers 112 retain the amplified signals 132. When the output enable signal 142 is active, the output buffers 112 send the stored data 146 in the output buffers 112 from the SRAM 100 to other circuits.

When the memory cell array 104 is written to, an address 144 is input to the address registers 118 and the write enable signal 148 is activated. The address 144 stored in the address registers 118 is then clocked by a clock signal CK from the address registers to a row decoder 114 and a column decoder 116. In this example, the row decoder 114 drives a word line 157 in the memory cell array 104 to a logical high value. The selected word line 157 along with the selected bit lines determine which memory cells in the memory cell array 104 will be written to. The input enable signal IE allows data 136 previously stored in the input registers 120 to be written into the memory cell array 104.

Figure 2:
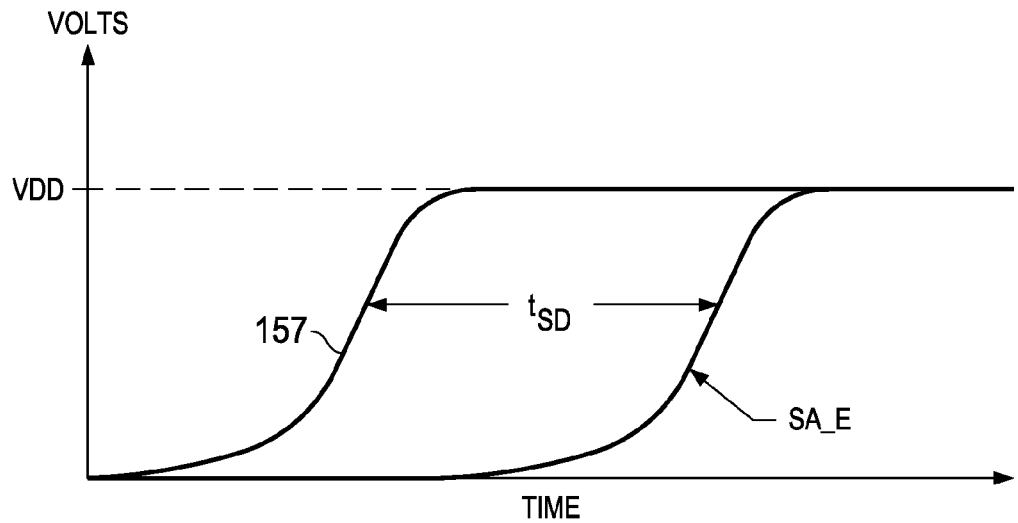
FIG. 2 is a timing diagram illustrating signal development time. (Prior Art)
Figure 3:
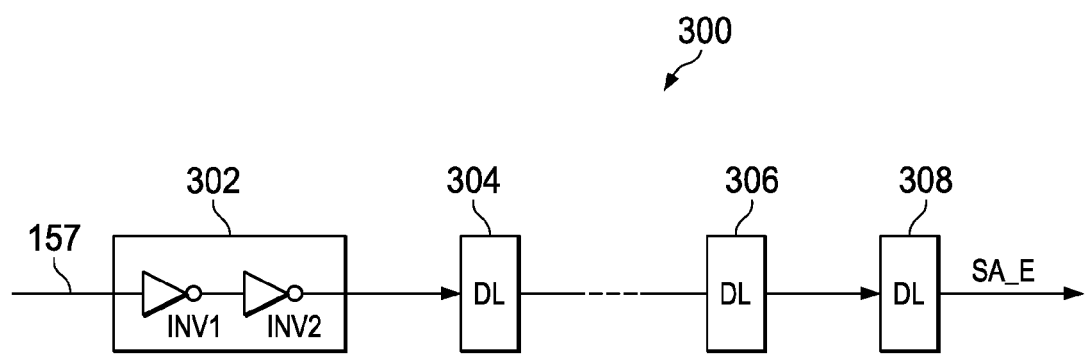
FIG. 3 is a block diagram of signal delay circuit. (Prior Art)

FIG. 2 is a timing diagram illustrating signal development time. The signal develop time $t_{sd}$ in this example is equal to the time measured from when the word line 157 is approximately 0.5*VDD to the time when the sense amp enable signal SA_E is approximately 0.5*VDD. The signal develop time may be implemented using delay blocks as shown in FIG. 3. In this example of signal delay circuit, the word line signal 157 is input to a delay block 302. Delay block 302 in this example consists of two inverters INV1 and INV2 in series. However, other types of circuits may be used to implement a delay block. The output of delay block 302 is input to delay block 304. The output of delay block 304 is input of another delay block not shown. The last two delay blocks of the signal delay circuit are 306 and 308. The number of delay blocks used is determined by the delay time needed.

During design of an SRAM, the signal development time is determined using models that estimate how much time is needed for a signal to develop on bit lines and have a sense amp accurately amplify the signal. However, because circuits do not always function as predicted by models, testing is needed to ensure that the time allowed is sufficient to correctly amplify the signal.

Figure 4:
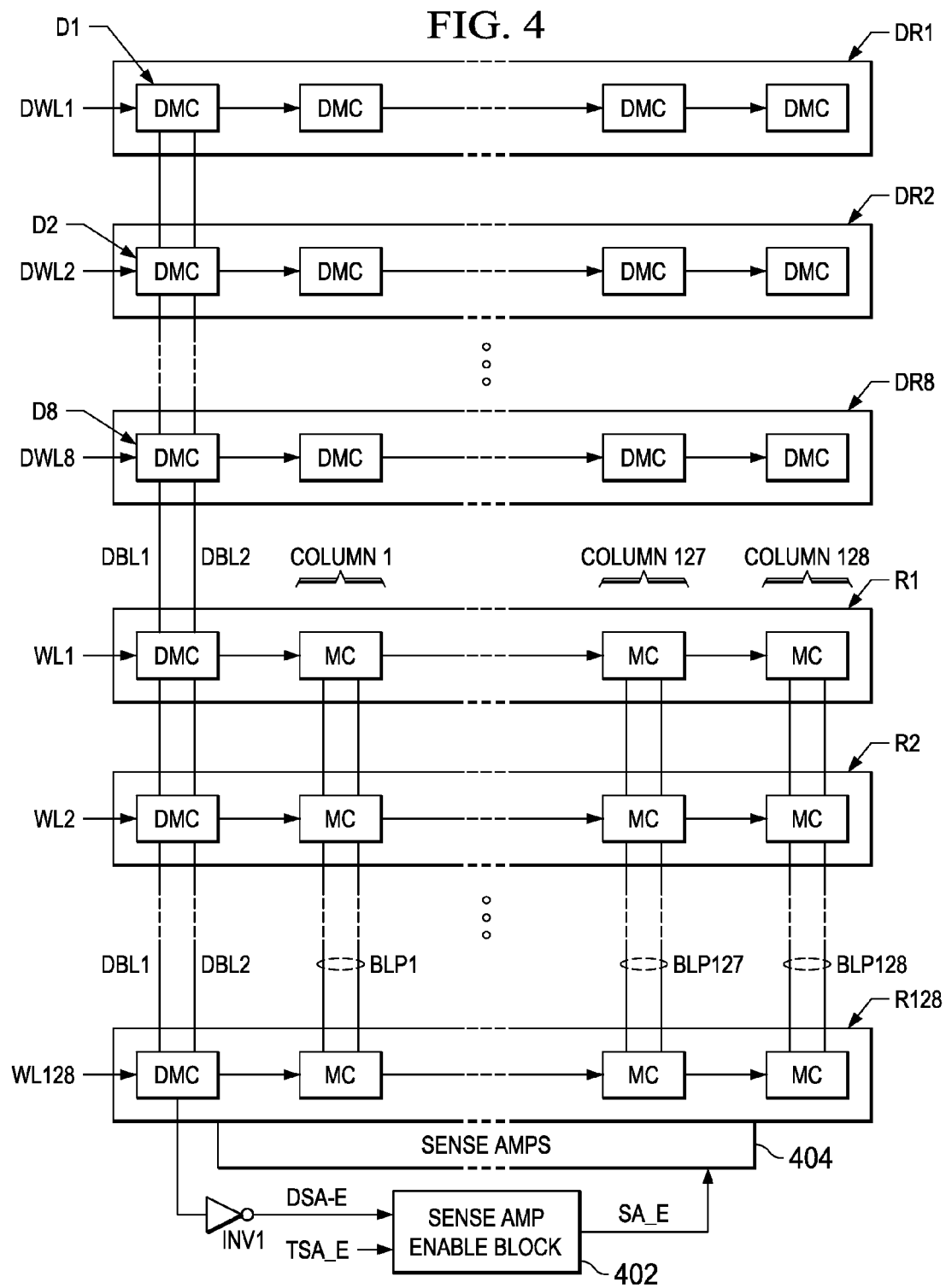
FIG. 4 is block diagram of a circuit that is used to determine the signal develop time of a memory cell. (Prior Art)

After SRAMs have been fabricated and before they are shipped to a customer, SRAMs are tested to insure that they function properly. To insure that an SRAM is functioning properly and to provide additional margin, the SRAM is tested with signal development time that is less than what the customer will use. This will ensure that SRAM bits that do not have sufficient margin with respect to customer use will be identified during testing. FIG. 4 is block diagram of a circuit that is used to vary the signal develop time of a memory cell.

FIG. 4 includes 8 dummy rows DR1-DR8. Each of these rows includes 128 dummy memory cells, DCM. The dummy memory cells are identical to a normal SRAM memory cell except these memory cells are "hard-wired" to a logical one or a logical zero value. A memory cell is hard-wired when the binary logical value stored in it is static and cannot be written to. These dummy memory cells are not used to retain actual data but are used to create loads for dummy word lines DWL1-DWL8 and to drive dummy bit lines DBL1 and DBL2. In this example, dummy bit line DBL1 is connected to an inverter INV1 that drives a sense amp enable block 402. In other embodiments of the invention either a non-inverting buffer or an inverting buffer may be used depending on the logical value on DBL1. The sense amp enable block 402 determines which signal is used to enable a selected sense amp.

FIG. 4 also includes 128 rows R1-R128. Each of these rows includes 1 dummy memory cell DCM and 128 memory cells. Word lines WL1-WL128 are electrically connected to the memory cells in their respectively rows R1-R128. However, the word lines are not directly electrically connected to the dummy memory cell DMC in their respective rows R1-R128. The single dummy memory cell is identical to a normal SRAM memory cell except that it is "hard-wired" to a logical one or a logical zero value. The single dummy memory cell is not used to retain actual data but is used to create loads for dummy bit lines DBL1-DBL2. The memory cells MC in rows R1-128 retain actual data. In this example, bit lines pairs BLP1-BLP128 are electrically connected to memory cells MC and sense amps SA in their respective columns C1-C128.

During normal operation (i.e. not being tested), any combination of dummy word lines DWL1-DWL8 is driven to high logical value and one word line, for example WL3, from word lines WL1-WL128 is selected by driving the word line WL3 to a logical high value. When WL3 is driven to a logical high value, memory cells MC contained in R3 are activated (dummy memory cell MC however is not activated) and bit line pairs BP1-BP128 are actively driven by the memory cell in its respective column C1-C128. In this example, a bit decoder (not shown) determines how many bits are sensed by sense amp SA in their columns C1-C128 and then driven to other circuit in the SRAM. During normal operation, the dummy sense enable signal DSA_E may be used to control the time that a signal is developed on the bit lines of a memory cell or a timed sense amp enable TSA_E that uses a signal delay circuit 300 (see FIG. 3) may be used to control the time that a signal is developed on the bit lines of a memory cell. The sense amp enable block 402 determines whether sense enable signal DSA_E or TSA_E is used during normal operation.

During normal operation, the time allowed for signal development can be varied by selecting one or more of the eight dummy memory cells D1-D8 electrically connected to the dummy bit lines DBL1 and DBL2. For example, when only a relatively slow access time is required, only one or two dummy memory cells are selected from the eight dummy memory cells D1-D8 by selecting two dummy word lines concurrently from the eight dummy word lines DL1-DWL8. However, when a relatively faster access time is required, six or more dummy memory cells are selected from the eight dummy memory cells D1-D8 by selecting six dummy word lines concurrently from the eight dummy word lines DL1-DWL8. The signal delay circuit 300 may also be used during normal operation but the signal development in this case is fixed by the signal delay circuit 300.

During operation of a signal development test, one or more dummy word lines DWL1-DWL8 are driven to a logical high level and one word line, for example WL3, from word lines WL1-WL128 is selected by driving the word line WL3 to a logical high value. The number of dummy word lines selected depends on how fast dummy bit lines DBL1 and DBL2 need to be driven. For example, only one dummy word line is driven when the dummy bit lines need to be driven relatively slowly. However, when dummy bit lines DBL1 and DBL2 need to be driven relatively fast, 6 or more dummy word lines are activated at the same time for example. In this embodiment of the invention, the most extreme screening of the access time of a memory cell in the SRAM takes place when all eight of the dummy memory cells D1-D8 are activated concurrently. All eight of the dummy memory cells D1-D8 are activated concurrently when all eight dummy word lines are driven to a logical high value concurrently.

As previously discussed, the dummy rows DR1-DR8 and the dummy bit lines DBL1 and DBL2 are added to test the signal development time of memory cells MC in an SRAM and to vary the time allowed for signal development during normal operation of the SRAM. None of the dummy memory cells DMC store actual data. Each dummy row DR1-DR8 has 128 dummy memory cells in order to create a load that is very similar to the load seen by a word line in one of the rows R1-R128. Only one dummy cell (i.e. D1-D8) in each dummy row DR1-DR8 drives the dummy bit lines DBL1 and BDBL2. More than one dummy row is used in order to be able to drive the dummy bit lines DBL1 and DBL2 faster. The dummy rows DR1-DR8 use area on an integrated circuit that contains an SRAM. An embodiment of the invention will now be described that reduces the number of dummy rows required to test signal development and to vary the signal development time during normal operation.

Figure 5:
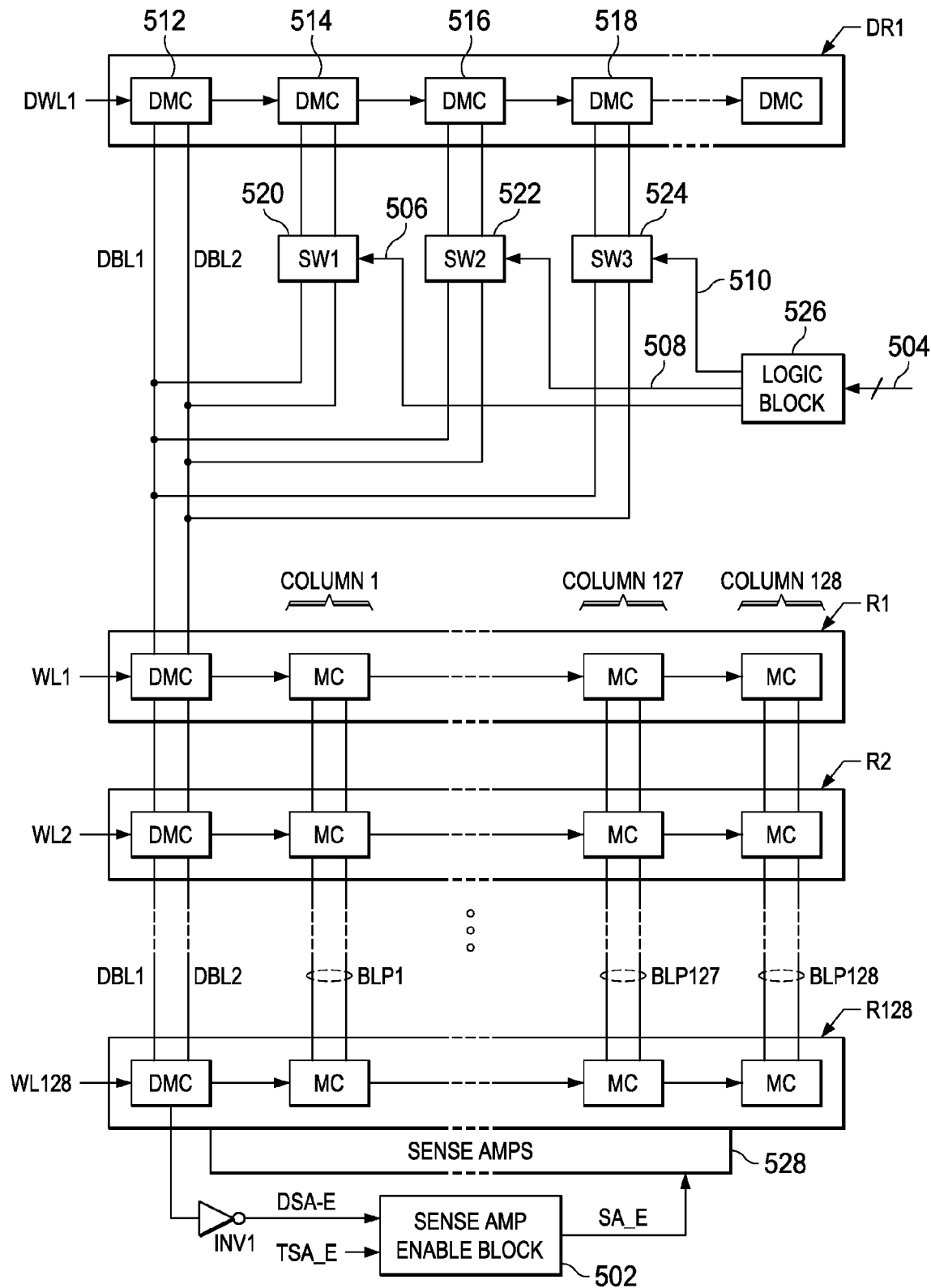
FIG. 5 is block diagram of a circuit used to determine the signal develop time of a memory cell in an SRAM according to an embodiment of the invention.

FIG. 5 is block diagram of a circuit used to test the signal develop time of a memory cell and to vary the signal development time during normal operation of an SRAM according to an embodiment of the invention. FIG. 5 includes 1 dummy row DR1. The dummy row DR1 includes 128 dummy memory cells, DCM. The dummy memory cells are identical to a normal SRAM memory cell except these memory cells are "hard-wired" to a logical one or a logical zero value. A memory cell is hard-wired when the binary logical value stored in it is static and cannot be written to. These dummy memory cells are not used to retain actual data but are used to create a load for dummy word line DWL1 and to drive dummy bit lines DBL1 and DBL2. In this example, dummy bit line DBL1 is connected to an inverter INV1 that drives a sense amp enable block 502. In other embodiments of the invention either a non-inverting buffer or an inverting buffer may be used depending on the logical value on DBL1. The sense amp enable block 502 determines which signal is used to enable a selected sense amp.

The number of dummy memory cells used to drive the dummy bit lines DBL1 and DBL2 may be selected by logic block 502. In this embodiment of the invention, a multi-bit signal 504 is input to the logic block 502. Based on the multi-bit signal 504, the outputs 506, 508 and 510 of the logic block 502 activates combinations of switches 520, 522 and 524 to allow 1, 2, 3 or 4 dummy memory cells to be selected from dummy memory cells 512, 514, 516 and 518. The dummy bit lines DBL1 and DBL2 are driven the slowest when only dummy memory cell 512 drives them. The dummy bit lines DBL1 and DBL2 are driven the fastest when dummy memory cells 512, 514, 516 and 518 drive them concurrently.

FIG. 5 also includes 128 rows R1-R128. Each of these rows includes 1 dummy memory cell DCM and 128 memory cells. Word lines WL1-WL128 are electrically connected to the memory cells in their respectively rows R1-R128. The single dummy memory cell is not used to retain actual data but is used to create loads for dummy bit lines DBL1-DBL2. The memory cells MC in rows R1-128 retain actual data. In this example, bit lines pairs BLP1-BLP128 are electrically connected to memory cells MC and sense amps SA in their respective columns C1-C128.

During normal operation, the time allowed for signal development can be varied by selecting one or more of the four dummy memory cells 512, 514, 516 and 518 electrically connected to the dummy bit lines DBL1 and DBL2 and the dummy word line DWL1. For example, when only a relatively slow access time is required, only one dummy memory cell is selected from the four dummy memory cells 512, 514, 516 and 518 by selecting the dummy word line DL1 and having the logic block 526 not select dummy memory cells 514, 516 and 518. However, when a relatively fast access time is required, all four dummy memory cells 512, 514, 516 and 518 are selected by selecting the dummy word line DWL1 and having the logic block 526 select dummy memory cells 514, 516 and 518. The signal delay circuit 300 may also be used during normal operation but the signal development in this case is fixed by the signal delay circuit 300.

During operation of a signal development test, the dummy word line DWL1 is driven to a logical high level and one word line, for example WL3, from word lines WL1-WL128 is selected by driving the word line WL3 to a logical high value. The number of dummy memory cells 512, 514, 516 and 518 determines how fast dummy bit lines DBL1 and DBL2 can to be driven. For example, only one dummy memory cell 512 is used when the dummy bit lines need to be driven relatively slowly. However, when dummy bit lines DBL1 and DBL2 need to be driven relatively fast, all four dummy memory cells 512, 514, 516 and 518 are used. In this embodiment of the invention, the most extreme screening of the access time of a memory cell in the SRAM takes place when all four of the dummy memory 512, 514, 516 and 518 are used. All four of the dummy memory cells 512, 514, 516 and 518 are activated by the logic block 526 when the multi-input signal 504 indicates that all four dummy memory cells should be selected.

As previously discussed, the dummy row DR1 and the dummy bit lines DBL1 and DBL2 are added to test the signal development time of memory cells MC in an SRAM and to vary the time allowed for signal development during normal operation of the SRAM. None of the dummy memory cells DMC store actual data. The dummy row DR1 has 128 dummy memory cells in order to create a load that is very similar to the load seen by a word line in one of the rows R1-R128. More than one dummy memory cell 512, 514, 516 and 518 is used in order to be able to drive the dummy bit lines DBL1 and DBL2 faster. Having a single dummy row DR1 instead of eight dummy row D1-D8 (see FIG. 4) reduces the amount area needed on an integrated circuit that contains an SRAM.

In another embodiment (not shown), two dummy rows may be used instead of one due to design constraints on the layout of memory cells. Often a single memory cell cannot be laid out as a single unit. As a result, four memory cells may be used to compose a repeatable memory unit. When this is the case, two dummy rows would be used. However, the same principles explained in the previous embodiment would be applied.

Figure 6:
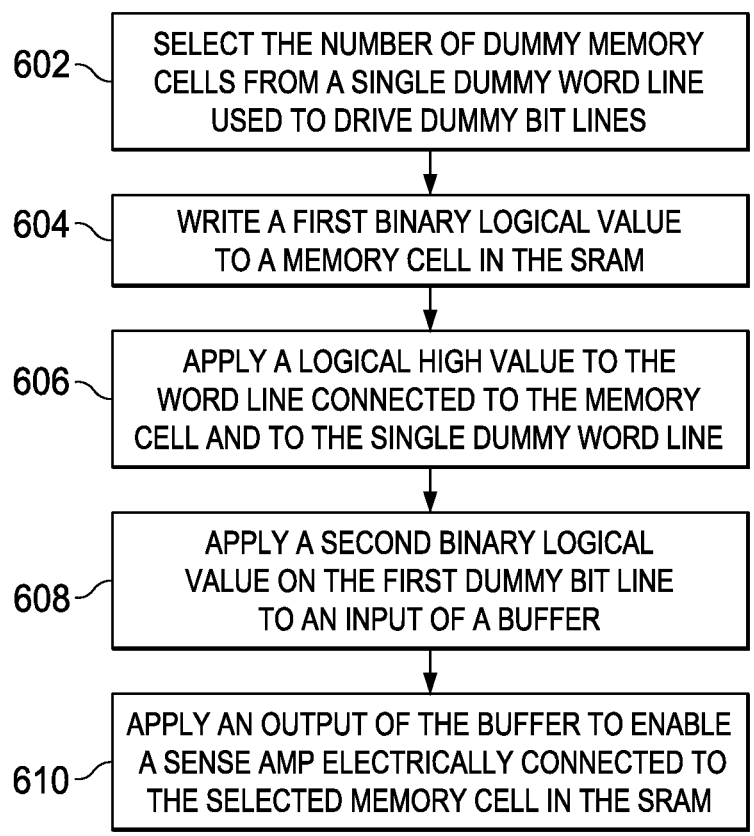
FIG. 6 is a flow chart illustrating a method of measuring the signal development time of an array of SRAM cells according to an embodiment of the invention.

FIG. 6 is a flow chart illustrating a method of testing the signal development time of a memory cell in an SRAM as well as a method of selecting the signal development time during normal operation of an SRAM according to an embodiment of the invention. During step 602, the number of dummy memory cells DMC selected from the plurality of dummy memory cells electrically connected to the single dummy word line DLW1 to drive the dummy bit lines DBL1 and DBL2 is selected. In this example, combinations of dummy memory cells 512, 514, 516 and 518 may be selected to drive the dummy bit lines DBL1 and DBL2. However, the dummy word line DWL1 may be configured to allow the selection of more or fewer dummy memory cells DMC in other embodiments of the invention. During step 604 a first binary logical value is written to a memory cell in the SRAM. After the first binary logical value is written to the memory cell in the SRAM, a logical high value is applied to the word line connected to the memory cell and to the single dummy word line DWL1 concurrently as described in step 606. Next the second binary logical value on the first dummy bit line DBL1 is applied to an input of a buffer as shown in step 608. The output of the buffer enables a sense amp to electrically connect to the selected memory cell in the SRAM as shown in step 610.

The foregoing description has been presented for purposes of illustration and description. It is not intended to be exhaustive or to limit the invention to the precise form disclosed, and other modifications and variations may be possible in light of the above teachings. The embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. A method of testing a memory cell in a static random access memory (SRAM) comprising:
   selecting a number of dummy cells from a first plurality of dummy memory cells that are electrically connected to a single dummy word line, a first dummy bit line and a second dummy bit line, wherein each dummy memory cell in the first plurality of dummy memory cells contains the same first binary logical value;
   writing a second binary logical value to the memory cell in the SRAM;
   applying a logical high value to a word line electrically connected to the memory cell in the SRAM;
   applying a logical high value to the single dummy word line wherein the selected number of dummy memory cells actively drive the first dummy bit line and the second dummy bit line, wherein the first dummy bit line is driven to a first voltage that represents the first binary logical value stored in the dummy memory cells and the second dummy bit line obtains the opposite logical value of the first binary logical value; wherein the word line and the single dummy word line are driven to logical high concurrently;
   applying the first binary logical value on the first dummy bit line to an input of a buffer wherein an output of the buffer enables a sense amp, the sense amp being electrically connected to a first bit line and a second bit line.

2. The method of claim 1 wherein the selected number of dummy memory cells in the first plurality of dummy memory cells is determined by a logic block.

3. The method of claim 1 wherein the first binary logical value stored in the dummy SRAM cells is a hard-wired logical zero.

4. The method of claim 3 wherein the buffer is an inverting buffer.

5. The method of claim 1 wherein the first binary logical value stored in the dummy SRAM cells is a hard-wired logical one.

6. The method of claim 5 wherein the buffer is a non-inverting buffer.

7. A method of selecting the amount of time for signal development in a static random access memory (SRAM) comprising:
   selecting a number of dummy cells from a first plurality of dummy memory cells that are electrically connected to a single dummy word line, a first dummy bit line and a second dummy bit line, wherein each dummy memory cell in the first plurality of dummy memory cells contains the same first binary logical value;
   writing a second binary logical value to the memory cell in the SRAM;
   applying a logical high value to a word line electrically connected to the memory cell in the SRAM;
   applying a logical high value to the single dummy word line wherein the selected number of dummy memory cells actively drive the first dummy bit line and the second dummy bit line, wherein the first dummy bit line is driven to a first voltage that represents the first binary logical value stored in the dummy memory cells and the second dummy bit line obtains the opposite logical value of the first binary logical value; wherein the word line and the dummy word line are driven to logical high concurrently;
   applying the first binary logical value on the first dummy bit line to an input of a buffer wherein an output of the buffer enables a sense amp, the sense amp being electrically connected to a first bit line and a second bit line.

8. The method of claim 7 wherein the selected number of dummy memory cells in the first plurality of dummy memory cells is determined by a logic block.

9. The method of claim 7 wherein the first binary logical value stored in the dummy SRAM cells is a hard-wired logical zero.

10. The method of claim 9 wherein the buffer is an inverting buffer.

11. The method of claim 7 wherein the first binary logical value stored in the dummy SRAM cells is a hard-wired logical one.

12. The method of claim 11 wherein the buffer is a non-inverting buffer.

* * * * *